(12) United States Patent
Du

(10) Patent No.: US 7,671,566 B2
(45) Date of Patent: Mar. 2, 2010

(54) METHOD FOR PREDICTING REMAINING CAPACITY OF A BATTERY

(75) Inventor: Ben-Chuan Du, Taipei Hsien (TW)

(73) Assignee: Qisda Corporation, Taoyuan County (TW)

( * ) Notice: Subject to any disclaimer, the term of this patent is extended or adjusted under 35 U.S.C. 154(b) by 278 days.

(21) Appl. No.: 11/943,593

(22) Filed: Nov. 21, 2007

(65) Prior Publication Data

US 2008/0116853 A1    May 22, 2008

(30) Foreign Application Priority Data

Nov. 21, 2006    (TW) .............................. 95143070 A

(51) Int. Cl.
*H02J 7/00* (2006.01)
*H02J 7/04* (2006.01)
*H02J 7/16* (2006.01)

(52) U.S. Cl. .................. 320/134; 320/132; 320/152; 320/162

(58) Field of Classification Search .................. 320/134
See application file for complete search history.

(56) References Cited

U.S. PATENT DOCUMENTS 5,561,362 A * 10/1996 Kawamura et al. .......... 320/134
7,321,220 B2 * 1/2008 Plett ........................... 320/128

* cited by examiner

*Primary Examiner*—Edward Tso
*Assistant Examiner*—Ahmed Omar

(57) ABSTRACT

A method for predicting remaining capacity of a battery includes: (a) determining an initial battery capacity; (b) measuring a second voltage; (c) calculating a maximum possible battery voltage and a minimum possible battery voltage according to the second voltage, a maximum possible battery current and a minimum possible battery current, and an internal resistance; (d) calculating a maximum possible battery remaining capacity and a minimum possible battery remaining capacity according to the maximum possible battery voltage, the minimum possible battery voltage, and the voltage-remaining capacity table; (e) comparing the maximum possible battery current with the minimum possible battery current; and (f) calculating a remaining capacity of the battery according to a comparison result in step (e), the maximum possible battery remaining capacity, and the minimum possible battery remaining capacity.

22 Claims, 4 Drawing Sheets

METHOD FOR PREDICTING REMAINING CAPACITY OF A BATTERY

BACKGROUND OF THE INVENTION

1. Field of the Invention

The present invention relates to a method for predicting remaining capacity of a battery, and more specifically, to a method for utilizing a voltage revision method and a current integration method in a software manner to predict remaining capacity of a battery more precisely.

2. Description of the Prior Art

In modern society, batteries are utilized to supply electronic products with power to avoid an inconvenience of using power lines. However, power of a battery is depleted with operation of the electronic product. Thus, charging is necessary for a battery. In general, portable electronic devices, such as mobile phones, utilize chargeable batteries as a power supply. For a user, it is important to know remaining capacity of a battery while operating an electronic device. As for the electronic device, it is also necessary to predict the remaining capacity of the battery, so as to preserve partial power for emergency use, such as a one-minute emergency call. However, under-prediction of the remaining capacity of the battery may result in a greater number of times that the battery is charged. This will shorten the battery's life. On the contrary, over-prediction of the remaining capacity of the battery could reduce power for emergency use or cause the user to encounter a shortage of power. Therefore, how to predict remaining capacity of a battery precisely should be a concern.

Related methods for predicting remaining capacity of a battery according to the prior art are provided as follows.

Intelligent battery technique (current integration method): This method involves putting a battery management chip inside a battery, such as a fuel gauge. The battery management chip can monitor a current status of the battery at any time so as to calculate the remaining capacity of the battery. Then, built-in software can directly read information stored in the battery management chip. The advantages of the method are low software loading and precise calculation of the remaining capacity. But, the method results not only in an increase of cost, but also additional power consumption caused by the power management chip (even in a turned-off state). In addition, after installing a new battery, a learning time is required to increase the accuracy of the remaining capacity calculation. And, a user's operation habits can also affect the accuracy (if the user often charges the battery before the power of the battery runs out, there will be a considerable error in the remaining capacity calculation). And, it is likely that a hardware cost of the battery management chip affects the selling price. Furthermore, it is difficult for this method to achieve the same accuracy in the remaining capacity calculation if the battery management chip is replaced with software.

Battery internal resistance method: This method involves establishing a battery remaining capacity-battery internal resistance table. Subsequently, remaining capacity of the battery can be calculated by a look-up method based on the said table after the mobile phone reads an internal resistance of the battery every period of time. However, a battery installed inside a mobile phone is usually a lithium battery. There is a considerable error in the remaining capacity calculation according to this method, since the internal resistance variation corresponding to the remaining capacity in a lithium battery is very small.

Voltage method: This method involves establishing a battery remaining capacity-battery voltage table in advance. Remaining capacity of a battery can be calculated by a look-up method based on the said table after the mobile phone reads a voltage of the battery every period of time. Simple calculation is the advantage of this method. But the drawback of this method is that the voltage of the battery affects the accuracy of this method, since the voltage of the battery varies with the power consumption of the battery. In addition, the accuracy of the battery remaining capacity-battery voltage table also affects the remaining capacity prediction greatly.

Method for adjusting voltage based on current: This method involves reading a current and a voltage of a battery at the same time, adjusting the voltage based on the current, and then determining remaining capacity of the battery based on a look-up method. The accuracy of this method is higher than the said voltage method. But the drawback of this method is increase of cost due to additional hardware for reading the current of the battery.

Method for adjusting voltage based on status: This method involves determining a current of a battery based on software rather than reading the current of the battery directly. Higher accuracy than the said voltage method and no additional cost are the advantages of this method. However, software cannot determine the actual current of the battery precisely. In addition, components installed inside the mobile phone, whose power consumption is directly proportional to time, can also increase calculation error.

In summary, all of the aforementioned methods for predicting remaining capacity of a battery have their respective drawbacks. Therefore, how to predict remaining capacity of a battery precisely without adding additional hardware should be a concern.

SUMMARY OF THE INVENTION

It is therefore a primary objective of the present invention to provide a method for predicting remaining capacity of a battery to solve the above-mentioned problem.

The present invention provides a method for predicting remaining capacity of a battery comprising: (a) determining an initial battery capacity; (b) measuring a second voltage of the battery; (c) calculating a maximum possible battery voltage and a minimum possible battery voltage according to the second voltage, a maximum possible battery current and a minimum possible battery current provided by a power manager, and an internal resistance; (d) calculating a maximum possible battery remaining capacity and a minimum possible battery remaining capacity according to the maximum possible battery voltage, the minimum possible battery voltage, and a voltage-remaining capacity table; (e) comparing the maximum possible battery current with the minimum possible battery current; and (f) calculating a remaining capacity according to a comparison result of step (e), the maximum possible battery remaining capacity, and the minimum possible battery remaining capacity.

The present invention further provides an electronic device for performing the method for predicting remaining capacity of a battery.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
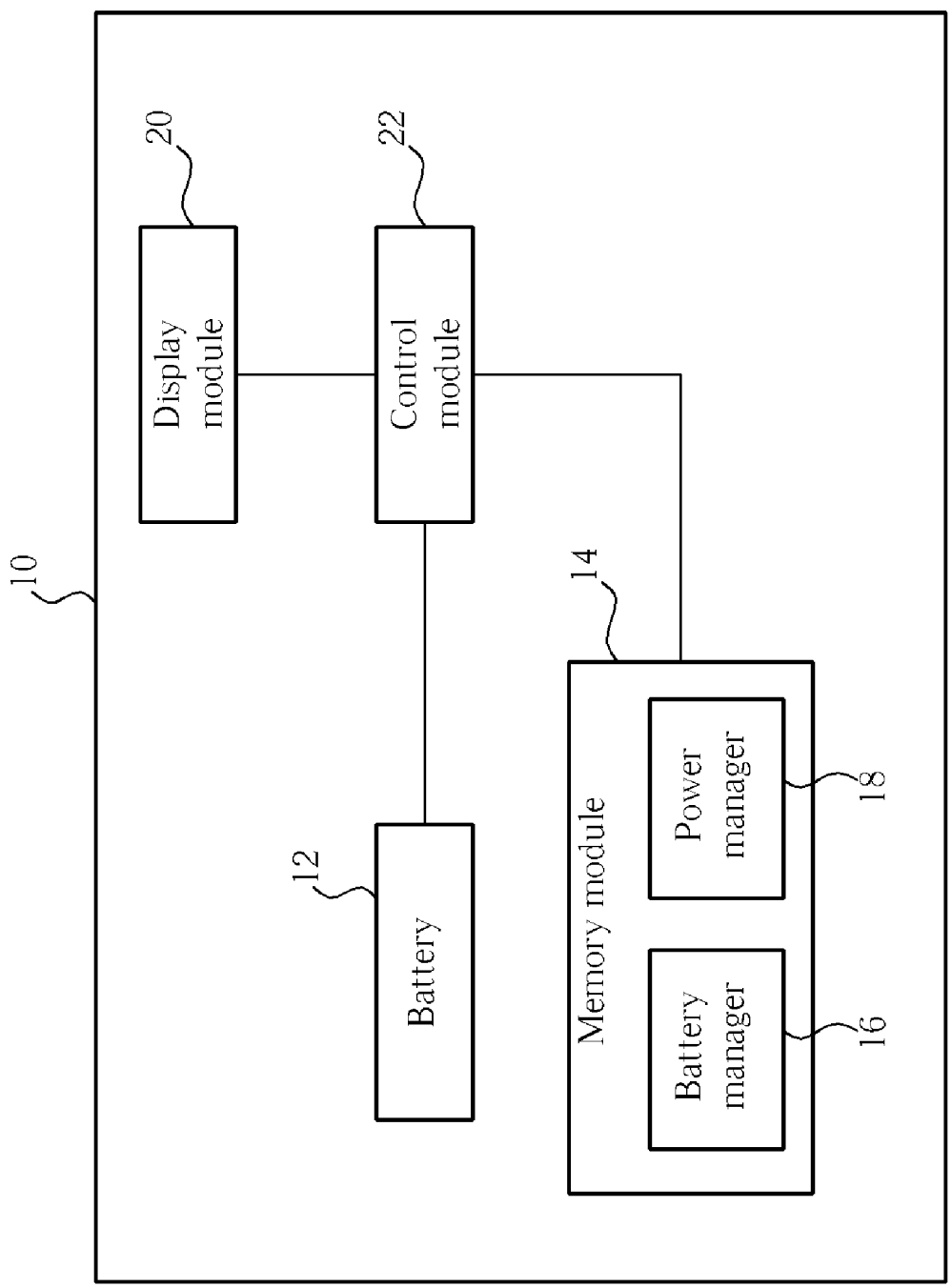
FIG. 1 is a functional block diagram of an electronic device according to the present invention.

Please refer to FIG. 1. FIG. 1 is a functional block diagram of an electronic device 10 according to the present invention. The electronic device 10 can be a wireless mobile communication device, such as a mobile phone. The electronic device 10 comprises a battery 12 for supplying the electronic device 10 with power, a memory module 14 for saving a battery manager 16 and a power manager 18, a display module 20 for displaying information about remaining capacity of the battery 12, and a control module 22 for controlling operation of the electronic device 10.

Figure 2:
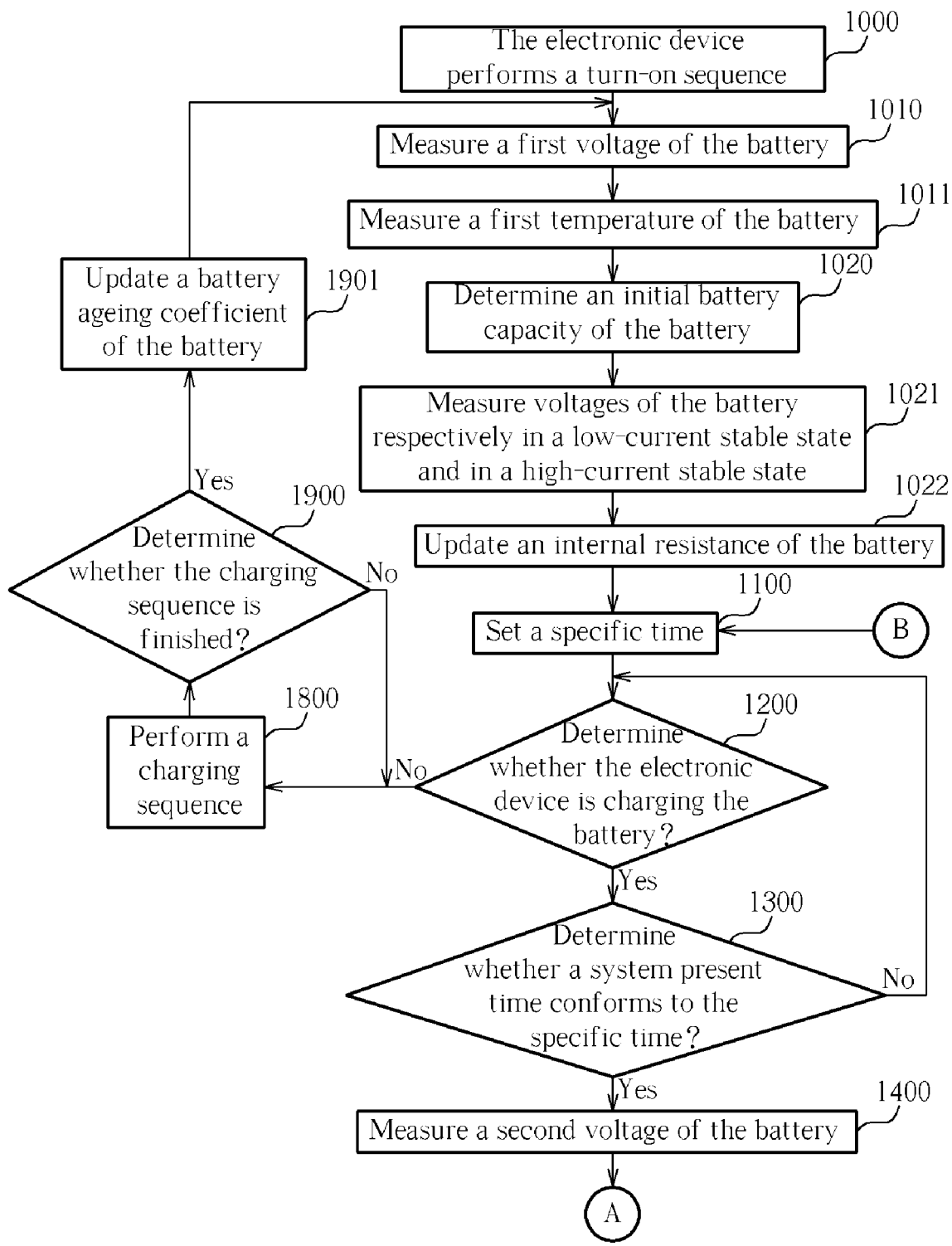
FIG. 2 and FIG. 3 are flowcharts of predicting the remaining capacity of the battery by utilizing the battery manager according to the present invention.
Figure 3:
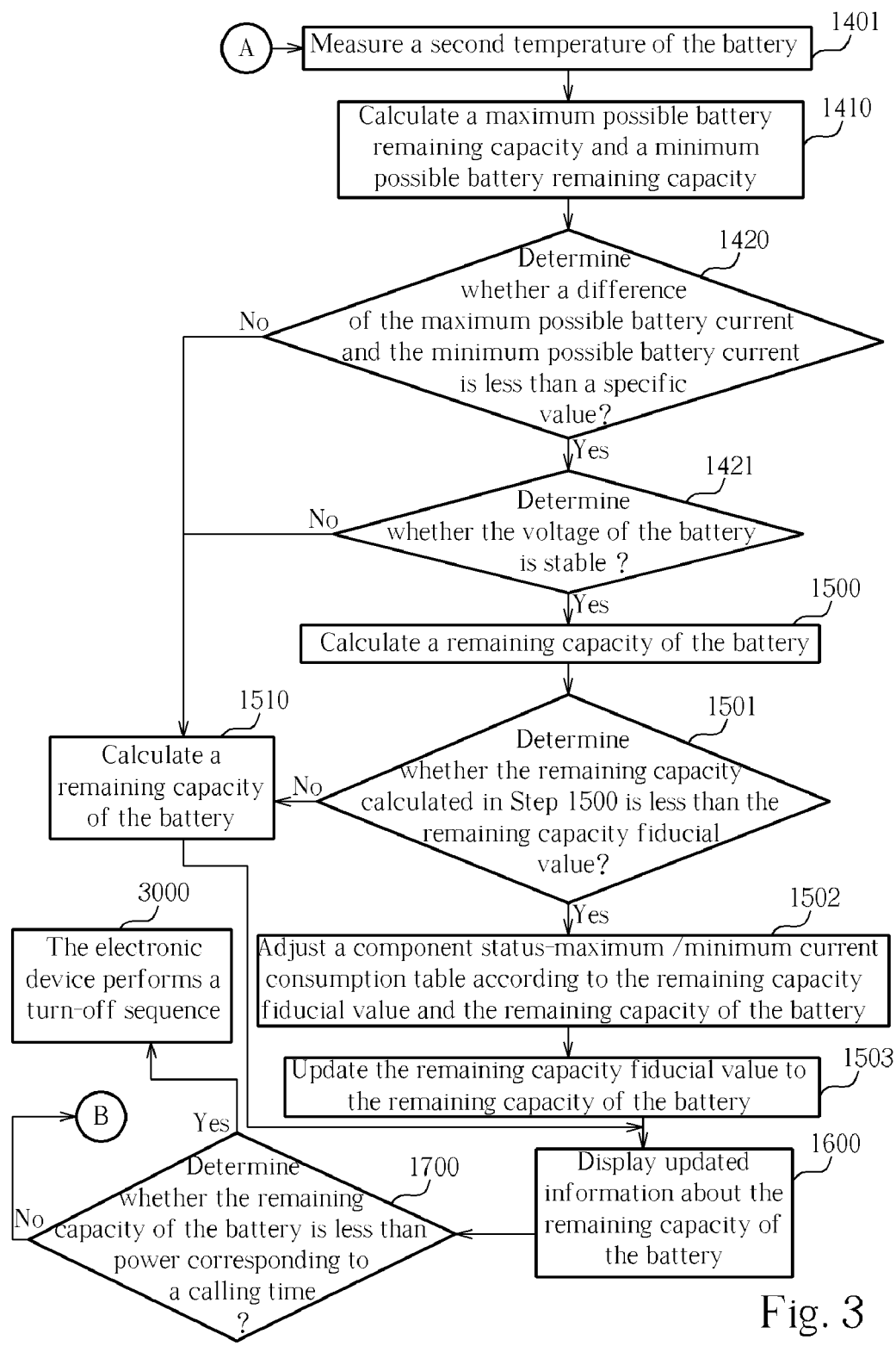
Figure 4:
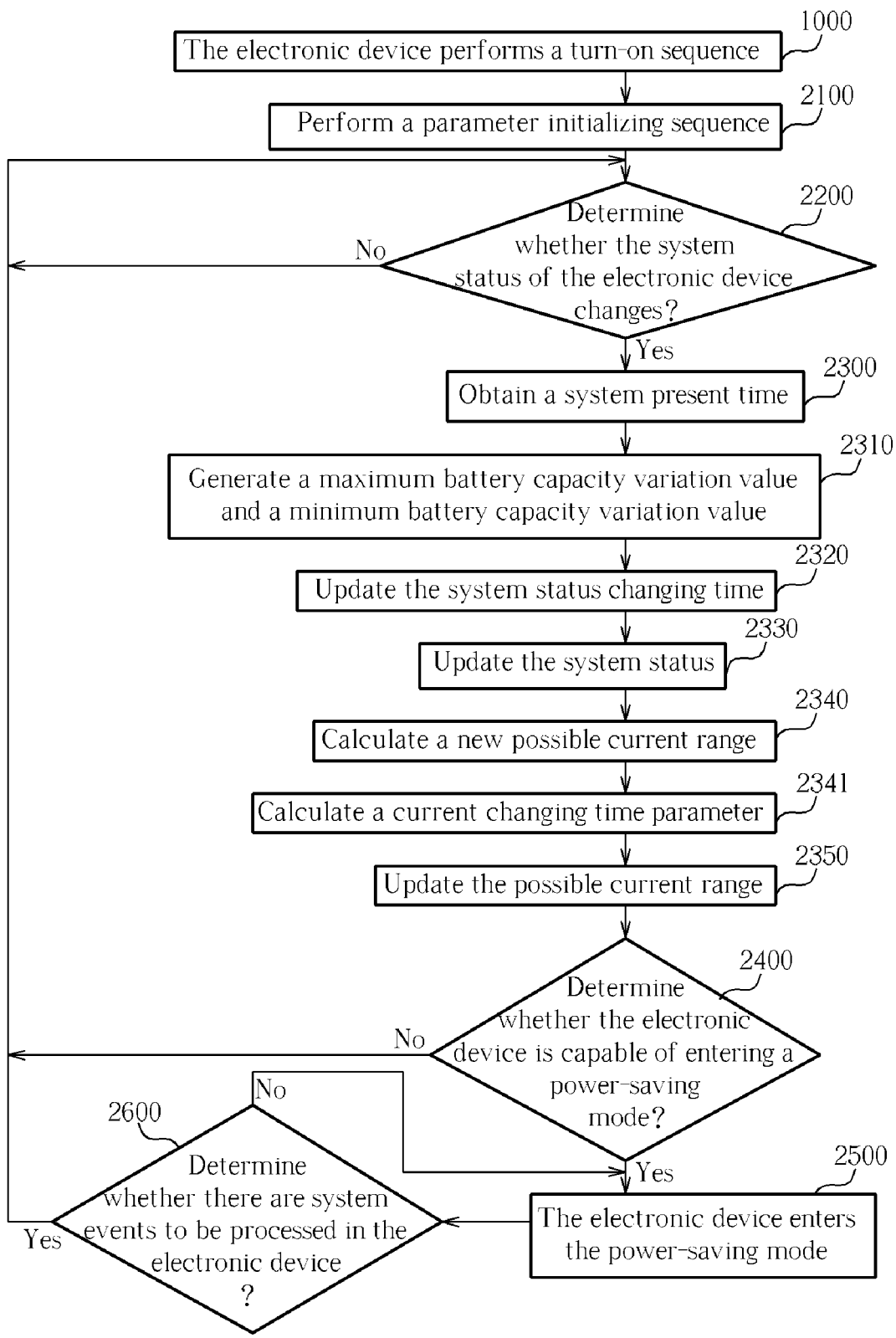
FIG. 4 is a flowchart of predicting the remaining capacity of the battery by utilizing the power manager according to the present invention.

Please refer to FIG. 2, FIG. 3, and FIG. 4. FIG. 2 and FIG. 3 are flowcharts of predicting the remaining capacity of the battery 12 by utilizing the battery manager 16 according to the present invention. FIG. 4 is a flowchart of predicting the remaining capacity of the battery 12 by utilizing the power manager 18 according to the present invention. The battery manager 16 is used for monitoring the remaining capacity status of the battery 12. The power manager 18 is used for monitoring the system power-saving status. Steps in FIG. 2 and FIG. 3 are expressed as follows:

Step 1000: The electronic device 10 performs a turn-on sequence;

Step 1010: Measure a first voltage of the battery 12;

Step 1011: Measure a first temperature of the battery 12;

Step 1020: Determine an initial battery capacity of the battery 12 according to the first voltage measured in Step 1000, a voltage-remaining capacity table, a temperature-capacity effective percentage table, and the first temperature measured in Step 1011, and set the initial battery capacity as a remaining capacity of the battery 12;

Step 1021: Measure voltages of the battery 12 respectively in a low-current stable state and in a high-current stable state;

Step 1022: Calculate and update an internal resistance of the battery 12 according to the measurement result in Step 1021;

Step 1100: Set a specific time;

Step 1200: Determine whether the electronic device 10 is charging the battery 12. If so, go to Step 1800; if not, go to Step 1300;

Step 1300: Determine whether a system present time conforms to the specific time. If so, go to Step 1400; if not, go back to Step 1200;

Step 1400: Measure a second voltage of the battery 12;

Step 1401: Measure a second temperature of the battery 12;

Step 1410: Calculate a maximum possible battery voltage and a minimum possible battery voltage according to the second voltage measured in Step 1400, a maximum possible battery current and a minimum possible battery current provided by the power manager 18, and the internal resistance, and calculate a maximum possible battery remaining capacity and a minimum possible battery remaining capacity according to the maximum possible battery voltage, the minimum possible battery voltage, the second temperature measured in Step 1401, the voltage-remaining capacity table, and the temperature-capacity effective percentage table;

Step 1420: Determine whether a difference of the maximum possible battery current and the minimum possible battery current is less than a specific value. If so, go to Step 1421; if not, go to Step 1510;

Step 1421: Determine whether the voltage of the battery 12 is stable. If so, go to Step 1500; if not, go to Step 1510;

Step 1500: Calculate a remaining capacity of the battery 12 according to the maximum possible battery remaining capacity, a minimum possible battery remaining capacity, and a remaining capacity fiducial value;

Step 1501: Determine whether the remaining capacity calculated in Step 1500 is less than the remaining capacity fiducial value. If so, go to Step 1502; if not, go to Step 1510;

Step 1502: Adjust a component status-maximum/minimum current consumption table according to the remaining capacity fiducial value and the remaining capacity of the battery 12;

Step 1503: Update the remaining capacity fiducial value to the remaining capacity of the battery 12;

Step 1510: Calculate the remaining capacity of the battery 12 according to the maximum possible battery remaining capacity, the minimum possible battery remaining capacity, a maximum battery capacity variation value and a minimum battery capacity variation value provided by the power manager 18, and the initial battery capacity (or the latest calculated remaining capacity);

Step 1600: The control module 22 controls the display module 20 to display updated information about the remaining capacity of the battery 12;

Step 1700: Determine whether the remaining capacity of the battery 12 is less than power corresponding to a calling time. If so, go to Step 3000; if not, go back to Step 1100;

Step 1800: The electronic device 10 performs a charging sequence;

Step 1900: Determine whether the charging sequence is finished. If so, go to Step 1901; if not, go back to Step 1800;

Step 1901: Update a battery ageing coefficient of the battery 12 according to the charging status of the battery 12;

Step 3000: The electronic device 10 performs a turn-off sequence.

Steps in FIG. 4 are expressed as follows:

Step 1000: The electronic device 10 performs a turn-on sequence;

Step 2100: Perform a parameter initializing sequence;

Step 2200: Determine whether the system status of the electronic device 10 changes (such as switching of components). If so, go to Step 2300; if not, execute Step 2200 again;

Step 2300: Obtain a system present time;

Step 2310: Generate the maximum battery capacity variation value and the minimum battery capacity variation value according to the maximum possible battery current, the minimum possible battery current, and a system status changing time;

Step 2320: Update the system status changing time;

Step 2330: Update the system status;

Step 2340: Calculate a new possible current range (from the maximum possible battery current to the minimum possible battery current) according to the new system status updated in Step 2330 and the component status-maximum/minimum current consumption table;

Step 2341: Calculate a current changing time parameter according to the maximum possible battery current and the minimum possible battery current calculated in Step 2340, the latest maximum possible battery current, the latest minimum possible battery current, and a current variation-time-voltage variation table;

Step 2350: Update the possible current range (from the maximum possible battery current to the minimum possible battery current) according to the calculation result in Step 2340;

Step 2400: Determine whether the electronic device 10 is capable of entering a power-saving mode. If so, go to Step 2500; if not, go back to Step 2200;

Step 2500: The electronic device 10 enters the power-saving mode;

Step 2600: Determine whether there are system events to be processed in the electronic device 10. If so, go back to Step 2200; if not, go back to Step 2500.

More detailed description for the aforementioned steps is provided as follows. When the electronic device 10 just starts a turn-on sequence, the battery capacity variation is stable, because the power consumption variation usually remains stable and the battery has already remained still for a period of time. In addition, voltage and temperature of the battery can affect the battery capacity considerably between −10° C. and 70° C. (operational temperature range of a mobile phone). For example, the lower temperature results in lower battery capacity. Thus, the first step is to measure the first voltage and the first temperature of the battery 12, and then the initial battery capacity can be calculated more precisely according to the first voltage, the first temperature, the voltage-remaining capacity table, and the temperature-capacity effective percentage table. The said initial battery capacity is used as a basis of a following calculation. Next, measure voltages of the battery 12 respectively in a low-current stable state and in a high-current stable state. It should be mentioned that when the electronic device 10 is in a standby state, the electronic device 10 can reach the low-current stable state or the high-current stable state, and when the electronic device 10 (such as a mobile phone) is coupled to a base station with a certain frequency, the electronic device 10 can reach the high-current stable state. As mentioned above, a battery installed inside a mobile phone is usually a lithium battery. Therefore, the battery internal resistance method cannot be applied to prediction of the remaining capacity of the battery 12, since the internal resistance variation corresponding to the remaining capacity in the lithium battery is very small. However, over a short time, the actual internal resistance can still be calculated and then be updated based on the voltages of the battery 12 respectively measured in the low-current stable state and in the high-current stable state. The related formula is expressed as follows:

Internal resistance=((the voltage of the battery 12 measured in the high-current stable state)−(the voltage of the battery 12 measured in the low-current stable state))/((the current of the battery 12 measured in the high-current stable state)−(the current of the battery 12 measured in the low-current stable state))

Next, the specific time (such as one minute) for updating the remaining capacity of the battery 12 regularly is set. Next, it is determined whether the electronic device 10 is charging the battery 12. If so, the battery ageing coefficient (an adjustable parameter) is updated after the electronic device 10 finishes charging the battery 12, e.g. once the battery 12 is full of power, after the plug of the battery charger is pulled out, or when a charging error occurs, instead of performing the following steps. This is because the battery capacity is depleted with the number of times charged. Therefore, the battery ageing coefficient should be updated according to the charging status of the battery 12 after the electronic device 10 finishes charging the battery 12. On the contrary, if the electronic device 10 is not charging the battery 12 and the system present time (obtained in Step 2300 or Step 2320) conforms to the specific time set in Step 1100, the following steps are performed. But if the system present time does not conform to the specific time set in Step 1100 yet, then the following steps are not performed until the system present time conforms to the specific time.

Next, the second voltage and the second temperature of the battery 12 are measured, and the maximum possible battery voltage and the minimum possible battery voltage are calculated according to the second voltage measured in Step 1400, the maximum possible battery current and the minimum possible battery current provided by the power manager 18 (Step 2340, Step 2350), and the internal resistance updated in Step 1022. The related formulas are expressed as follows:

Maximum possible battery voltage=(the second voltage)+(the maximum possible battery current)*(the internal resistance);

Minimum possible battery voltage=(the second voltage)+(the minimum possible battery current)*(the internal resistance);

Next, a look-up method is used to calculate the maximum possible battery remaining capacity and the minimum possible battery remaining capacity according to the maximum possible battery voltage, the minimum possible battery voltage, the second temperature measured in Step 1401, the voltage-remaining capacity table, and the temperature-capacity effective percentage table.

Next, the current variation status of the battery 12 is determined. When the current variation of the battery 12 is large, the system status is less stable. That is to say, when the current variation of the battery 12 is large, the reliability of the calculated current is lower, since there are more uncertain factors in the remaining capacity calculation. As a result, more parameters are required for predicting the remaining capacity (such as in Step 1510). On the contrary, when the current variation of the battery 12 is small, the system status is more stable. That is to say, when the current variation of the battery 12 is small, the reliability of the calculated current is higher, since there are fewer uncertain factors in the remaining capacity calculation. As a result, the remaining capacity can be predicted directly based on the calculation result in Step 1410 without referring to a capacity variation estimation provided by the power manager 18. When it is determined that a difference of the maximum possible battery current and the minimum possible battery current is less than the specific value, it means that the current variation of the battery 12 is small. Then, it is determined whether the voltage of the battery 12 is stable. Whether the voltage of the battery 12 is stable can be determined based on a comparison result of a current changing time parameter provided by the power manager 18 and a system present time (obtained in Step 2300 or Step 2320). More description for the current changing time parameter is provided as follows. When the current of the battery 12 changes from high to low in a short time, and then maintains a low-current output state, the voltage of the battery 12 accordingly rises at once. However, a period of time (battery chemical reaction time) is still required to arrive at a stable value. The period of time is a time needed for stabilizing the voltage of the battery 12, namely the current changing time parameter (Step 2341). The current changing time parameter can be calculated according to the maximum possible battery current and the minimum possible battery current calculated in Step 2340, the latest maximum possible battery current and the minimum possible battery current, and a current variation-time-voltage variation table. In other words, a time needed for the voltage of the battery 12 to stabilize, namely the current changing time parameter (Step 2341), can be calculated by a look-up method according to a difference of the maximum possible battery current and the minimum possible battery current calculated in Step 2340, a difference of the latest maximum possible battery current and the minimum possible battery current, and a current variation-time-voltage variation table. Furthermore, the remaining capacity of the battery 12 is underestimated easily when updating the remaining capacity fiducial value before the voltage of the battery 12 is stable. The said situation can be avoided by comparing the system present time with the current changing time parameter in Step 1421.

Next, when it is determined that the voltage of the battery 12 is stable, meaning that the system present time conforms to the current changing time parameter, a remaining capacity of the battery 12 is calculated (Step 1500). On the contrary, when it is determined that the voltage of the battery 12 is not stable, it means that more parameters are required for predicting the remaining capacity of the battery 12 (Step 1510). In step 1500, the remaining capacity of the battery 12 is calculated according to the maximum possible battery remaining capacity and the minimum possible battery remaining capacity calculated in Step 1410 and the remaining capacity fiducial value (or other parameters). The remaining capacity fiducial value can be equal to the initial battery capacity, or can be set to a larger fiducial value. There are many methods for calculating the remaining capacity. Herein, two related formulas are expressed as follows:

Remaining capacity=(the maximum possible battery remaining capacity+the minimum possible battery remaining capacity)/2; or Remaining capacity=((min(the maximum possible battery remaining capacity, the remaining capacity fiducial value))+(min(the minimum possible battery remaining capacity, the remaining capacity fiducial value)))/2

Next, it is determined whether the remaining capacity calculated in Step 1500 is less than the latest record of the remaining capacity fiducial value. If so, it means that the reliability of the remaining capacity calculated in Step 1500 is very high. As a result, the remaining capacity of the battery 12 can be updated to the remaining capacity fiducial value. On the contrary, it means that more parameters are still required for predicting the remaining capacity of the battery 12 (Step 1510) since the reliability of the remaining capacity calculated in Step 1500 is low. In general, in a non-charging state, the remaining capacity cannot increase. However, when the system lies in a small power consumption state over a long period of time, the prediction error caused by measurement error of the battery voltage/current could be larger than the actual battery remaining capacity variation. At this time, the said measurement error can be reduced by comparing the remaining capacity calculated in Step 1500 with the latest record of the remaining capacity fiducial value.

In the remaining capacity calculation, the existence of experimental errors or systemic errors caused by differences among components is inevitable, since the fixed parameters and the adjustable parameters are provided by experiment. The influence caused by errors in the fixed parameters and the adjustable parameters can be reduced in Step 1410, Step 1420, and Step 1510. However, if the errors in the fixed parameters and the adjustable parameters are not adjusted, the prediction error of the battery remaining capacity can be accumulated in high power consumption and high current variation conditions (such as when listening to MP3-encoded music at the greatest volume for several hours). Thus, adjusting for the errors in the fixed parameters and the adjustable parameters is necessary. By Step 1502, the adjustable parameters (such as the component status-maximum/minimum current consumption table) are adjusted properly according to the difference between the remaining capacity and the remaining capacity fiducial value.

In Step 1510, more parameters are utilized for predicting the remaining capacity. That is to say, in Step 1510, the remaining capacity is calculated more precisely according to the maximum possible battery remaining capacity, the minimum possible battery remaining capacity, the maximum possible battery capacity variation value and the minimum possible battery capacity variation value provided by the power manager 18, and the initial battery capacity (or the latest calculated remaining capacity). The maximum possible battery capacity variation value and the minimum possible battery capacity variation value provided by the power manager 18 are generated in Step 2310. In Step 2310, the maximum battery capacity variation value and the minimum battery capacity variation value are generated according to the maximum possible battery current, the minimum possible battery current, and the system status changing time. The said system status changing time is obtained in Step 2320, namely the system time of the time obtained in Step 2300 minus the system time of the last time obtained in Step 2300. In such a manner, the maximum battery capacity variation value and the minimum battery capacity variation value are generated by a current integration method according to the maximum possible battery current, the minimum possible battery current, and the system status changing time. The formulas are expressed as follows:

Maximum battery capacity variation value of this time=the maximum battery capacity variation value of last time+(the maximum possible battery current)*(the system status changing time);

Minimum battery capacity variation value of this time=the minimum battery capacity variation value of last time+(the minimum possible battery current)*(the system status changing time)

There are many kinds of methods for calculating the remaining capacity in Step 1510. One of them is expressed as follows:

$G$=the initial battery capacity (or the latest calculated remaining capacity)−the minimum battery capacity variation value;

$H$=the initial battery capacity (or the latest calculated remaining capacity)−the maximum battery capacity variation value;

$J$=min(the maximum possible battery remaining capacity, $G$);

$K$=max(the minimum possible battery remaining capacity, $H$);

if ($K > J$), the remaining capacity=$(K+J)/2$;

else if ($K = H$), the remaining capacity=$H$;

else, the remaining capacity=$G$;

Next, the control module 22 controls the display module 20 to display updated information about the remaining capacity (obtained in Step 1500 or Step 1510) of the battery 12, and the electronic device 10 performs a turn-off sequence to avoid affecting the normal use of the emergency call when it is determined that the remaining capacity of the battery 12 is less than power corresponding to a calling time (such as one minute). If it is determined that the battery remaining capacity of the battery 12 is larger than the power corresponding to the calling time, it means that the electronic device 10 can still supply power properly. At this time, go back to Step 1100 to continue predicting the remaining capacity of the battery 12.

Compared with the prior art, the present invention involves utilizing a voltage revision method and a current integration method in a software manner to predict remaining capacity of a battery more precisely without adding additional hardware. In addition, the present invention can also reduce errors caused by experiments or parameters. Thus, due to the precise prediction for remaining capacity of a battery, the present invention can make an electronic product more informative for a user.

Those skilled in the art will readily observe that numerous modifications and alterations of the device and method may be made while retaining the teachings of the invention.

What is claimed is:

1. A method for predicting remaining capacity of a battery comprising:
    (a) determining an initial battery capacity;
    (b) measuring a second voltage of the battery;
    (c) calculating a maximum possible battery voltage and a minimum possible battery voltage according to the second voltage, a maximum possible battery current and a minimum possible battery current provided by a power manager, and an internal resistance;
    (d) calculating a maximum possible battery remaining capacity and a minimum possible battery remaining capacity according to the maximum possible battery voltage, the minimum possible battery voltage, and a voltage-remaining capacity table;
    (e) comparing the maximum possible battery current with the minimum possible battery current; and
    (f) calculating a battery remaining capacity according to a comparison result of step (e), the maximum possible battery remaining capacity, and the minimum possible battery remaining capacity.

2. The method of claim 1, wherein step (a) comprises:
    (a1) measuring a first voltage of the battery; and
    (a2) calculating the initial battery capacity according to the first voltage and the voltage-remaining capacity table.

3. The method of claim 2, wherein step (a1) comprises measuring the first voltage of the battery after a turn-on sequence.

4. The method of the claim 2 further comprising measuring a temperature of the battery, wherein step (a2) comprises calculating the initial battery capacity according to the first voltage, the voltage-remaining capacity table, a temperature-capacity effective percentage table, and the temperature of the battery.

5. The method of claim 1 further comprising measuring voltages of the battery respectively in a low-current stable state and in a high-current stable state so as to generate a measurement result, and calculating and updating the internal resistance according to the measurement result.

6. The method of claim 1 further comprising updating a battery ageing coefficient of the battery according to a charging state of the battery.

7. The method of claim 1, wherein the maximum possible battery voltage in step (c) is (the second voltage)+(the maximum possible battery current)*(the internal resistance), and the minimum possible battery voltage in step (c) is (the second voltage)+(the minimum possible battery current)*(the internal resistance).

8. The method of claim 1 further comprising generating the maximum possible battery current and the minimum possible battery current in step (c) according to a system status and a component status-maximum/minimum current consumption table.

9. The method of claim 1 further comprising measuring a temperature of the battery, wherein step (d) comprises calculating the maximum possible battery remaining capacity and the minimum possible battery remaining capacity according to the maximum possible battery voltage, the minimum possible battery voltage, the voltage-remaining capacity table, a temperature-capacity effective percentage table, and the temperature of the battery.

10. The method of claim 1, wherein step (f) comprises calculating the battery remaining capacity according to the maximum possible battery remaining capacity, the minimum possible battery remaining capacity, a maximum battery capacity variation value and a minimum battery capacity variation value provided by the power manager, and the initial battery capacity or the latest calculated remaining capacity if a difference of the maximum possible battery voltage and the minimum possible battery voltage is greater than a specific value.

11. The method of claim 10 further comprising generating the maximum battery capacity variation value and the minimum battery capacity variation value according to the maximum possible battery current, the minimum possible battery current, and a system status changing time.

12. The method of claim 1 further comprising:
    (g) determining whether the voltage of the battery is stable; wherein step (f) comprises calculating the battery remaining capacity according to the determination result of step (g), the maximum possible battery remaining capacity, and the minimum possible battery remaining capacity if a difference of the maximum possible battery current and the minimum possible battery current is smaller than a specific value.

13. The method of claim 12, wherein step (g) comprises providing a current changing time parameter from the power manager, and determining whether the voltage of the battery is stable according to a comparison result of the current changing time parameter and a system present time.

14. The method of claim 13 further comprising calculating the current changing time parameter according to the maximum possible battery current, the minimum possible battery current, and a current variation-time-voltage variation table.

15. The method of claim 12, wherein step (f) comprises calculating the remaining capacity according to the maximum possible battery remaining capacity, the minimum possible battery remaining capacity, and a remaining capacity fiducial value if a difference of the maximum possible battery current and the minimum possible battery current is smaller than a specific value, and if the determination result of step (g) is that the voltage of the battery is stable.

16. The method of claim 15, wherein the remaining capacity fiducial value is equal to the initial battery capacity.

17. The method of claim 15 further comprising setting the remaining capacity as the remaining capacity fiducial value if the remaining capacity calculated in step (f) is less than the remaining capacity fiducial value.

18. The method of claim 15 further comprising calculating the remaining capacity according to the maximum possible battery remaining capacity, the minimum possible battery remaining capacity, a maximum battery capacity variation value and a minimum battery capacity variation value provided by the power manager, and the initial battery capacity if the remaining capacity calculated in step (f) is greater than the remaining capacity fiducial value.

19. The method of claim 18 further comprising generating the maximum battery capacity variation value and the minimum battery capacity variation value according to the maximum possible battery current, the minimum possible battery current, and a system status changing time.

20. The method of claim 18 further comprising adjusting a component status-maximum/minimum current consumption table according to the remaining capacity fiducial value and the remaining capacity.

21. The method of claim 1 further comprising executing a turn-off procedure when the remaining capacity is smaller than power corresponding to a calling time.

22. An electronic device for performing the method of claim 1.

* * * * *